United States Patent
Hu et al.

(10) Patent No.: US 11,402,709 B2
(45) Date of Patent: Aug. 2, 2022

(54) REPAIRING METHOD FOR BROKEN GATE AND DATA LINE IN ARRAY SUBSTRATE AND ARRAY SUBSTRATE

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Lang Hu, Beijing (CN); Yaohua Jiang, Beijing (CN); Yang Yu, Beijing (CN); Kaiqiang Li, Beijing (CN); Chaolei Wang, Beijing (CN); Nannan Rong, Beijing (CN); Yan Yang, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 707 days.

(21) Appl. No.: 16/335,816

(22) PCT Filed: Sep. 10, 2018

(86) PCT No.: PCT/CN2018/104813
§ 371 (c)(1),
(2) Date: Mar. 22, 2019

(87) PCT Pub. No.: WO2019/153736
PCT Pub. Date: Aug. 15, 2019

(65) Prior Publication Data
US 2021/0364874 A1   Nov. 25, 2021

(30) Foreign Application Priority Data

Feb. 6, 2018 (CN) .......................... 201810117823.0

(51) Int. Cl.
*G02F 1/1362* (2006.01)
*G02F 1/13* (2006.01)
*H01L 27/12* (2006.01)

(52) U.S. Cl.
CPC ...... *G02F 1/136263* (2021.01); *G02F 1/1309* (2013.01); *G02F 1/136286* (2013.01); *H01L 27/124* (2013.01)

(58) Field of Classification Search
CPC combination set(s) only.
See application file for complete search history.

(56) References Cited

U.S. PATENT DOCUMENTS

2009/0284680 A1   11/2009  Peng
2009/0322978 A1*  12/2009  Peng ................ G02F 1/136259
                                                                349/54

(Continued)

FOREIGN PATENT DOCUMENTS

CN        1959961 A        5/2007
CN        201004141 Y      1/2008

(Continued)

OTHER PUBLICATIONS

Search Report and Written Opinion for International Application No. PCT/CN2018/104813 dated Nov. 29, 2018.

*Primary Examiner* — Lauren Nguyen
(74) *Attorney, Agent, or Firm* — Calfee, Halter & Griswold LLP

(57) ABSTRACT

A repairing method for an array substrate is provided. The array substrate includes at least one defective signal line, which is a data line or a gate line having a breakpoint. The defective signal line is divided by the breakpoint into a first portion and a second portion. The repairing method includes disconnecting a connection between a first thin film transistor and a data line or a gate line to which the first thin film transistor is connected, the first thin film transistor being a (Continued)

thin film transistor closest to the breakpoint among thin film transistors connected to the first portion; electrically connecting a first terminal of the first thin film transistor to the first portion; and taking a common electrode line segment from a common electrode line to which the first pixel electrode corresponds as a repair line.

11 Claims, 9 Drawing Sheets

(56) References Cited

U.S. PATENT DOCUMENTS

| | | | | |
|---|---|---|---|---|
| 2013/0155342 | A1* | 6/2013 | Wu | H01L 22/20 349/43 |
| 2015/0185513 | A1* | 7/2015 | Wu | G02F 1/1368 257/72 |

FOREIGN PATENT DOCUMENTS

| | | |
|---|---|---|
| CN | 101216644 A | 7/2008 |
| CN | 101561565 A | 10/2009 |
| CN | 101581840 A | 11/2009 |
| CN | 101581856 A | 11/2009 |
| CN | 101614916 A | 12/2009 |
| CN | 102023429 A | 4/2011 |
| CN | 103278987 A | 9/2013 |
| CN | 103680326 A | 3/2014 |
| CN | 107065343 A | 8/2017 |
| CN | 108287442 A | 7/2018 |
| KR | 20080059928 A | 7/2008 |

* cited by examiner

REPAIRING METHOD FOR BROKEN GATE AND DATA LINE IN ARRAY SUBSTRATE AND ARRAY SUBSTRATE

RELATED APPLICATION

The present application is the U.S. national phase entry of PCT/CN2018/104813, with an international filling date of Sep. 10, 2018, which claims the benefit of Chinese Patent Application No. 201810117823.0, filed on Feb. 6, 2018, the entire disclosure of which is incorporated herein by reference.

TECHNICAL FIELD

The present disclosure relates to the field of display, and particularly to a repairing method for an array substrate and an array substrate.

BACKGROUND

Liquid crystal display panels possess the characteristics such as low power consumption, no radiation and the like, and have now occupied a dominant position in the field of flat display.

A liquid crystal display panel generally comprises an array substrate and a color filter substrate which are aligned together and sandwich liquid crystals. The array substrate comprises a base substrate, as well as gate lines, data lines, common electrode lines, common electrodes, thin film transistors (TFTs) and pixel electrodes arranged in a matrix which are disposed on the base substrate. The voltage difference between a pixel electrode and a common electrode is controlled to deflect liquid crystal molecules. The liquid crystal molecules are deflected at different angles, so that different amounts of light are transmitted, thereby generating different gray scales and realizing presentation of desired images.

In such an array substrate, each TFT does not have an individual gate to connect the TFT to a gate line, but the gate line is directly connected to a plurality of TFTs, and a part of the gate line serves as the gate of the TFT. The orthographic projection of the gate line on the base substrate overlaps that of the active layer of the TFT which is located between the source and the drain on the base substrate. When an effective voltage signal is input to the gate line, the source and the drain of the TFT are electrically connected, the sources of each column of TFTs are connected to one data line, so the data signal on the data line is transmitted to the pixel electrodes via the TFTs. If a certain gate line is broken, multiple pixels, even an entire row of pixels arranged along the broken gate line may be unable to be normally displayed; if a data line is broken, multiple pixels, even an entire column of pixels arranged along the broken data line may be unable to be normally displayed, thereby decreasing the yield of the display panel.

SUMMARY

An embodiment of the present disclosure provides a repairing method for an array substrate, the array substrate comprising a base substrate, a plurality of gate lines, a plurality of data lines, and a plurality of common electrode lines, the plurality of gate lines and the plurality of data lines defining a plurality of pixel regions, each pixel region being provided with a pixel electrode, the pixel electrode being connected to one data line through a thin film transistor, a first terminal of the thin film transistor being connected to the pixel electrode, a second terminal of the thin film transistor being connected to the data line. The array substrate comprises at least one defective signal line, the defective signal line being a data line having a breakpoint or a gate line having a breakpoint, the defective signal line being divided by the breakpoint into a first portion and a second portion. The repairing method comprises: disconnecting a connection between a first thin film transistor and a data line or a gate line to which the first thin film transistor is connected, the first thin film transistor being a thin film transistor closest to the breakpoint among thin film transistors connected to the first portion; electrically connecting a first terminal of the first thin film transistor to the first portion such that the first portion is electrically connected to a first pixel electrode connected to the first thin film transistor; taking a common electrode line segment from a common electrode line to which the first pixel electrode corresponds as a repair line, an orthographic projection of the repair line on the base substrate partially overlapping an orthographic projection of the first pixel electrode on the base substrate; and connecting the first pixel electrode to the second portion via the repair line.

In some embodiments, the defective signal line is the gate line having the breakpoint, the repairing method comprises disconnecting a connection between a second terminal of the first thin film transistor and the data line.

In some embodiments, an orthographic projection of the first terminal of the first thin film transistor on the base substrate partially overlaps an orthographic projection of the first portion of the defective signal line on the base substrate, the repairing method comprises connecting the first portion to the first terminal of the first thin film transistor by soldering.

In some embodiments, the orthographic projection of the repair line on the base substrate partially overlaps an orthographic projection of a second pixel electrode on the base substrate, the second pixel electrode is connected to a second thin film transistor, the second thin film transistor being a thin film transistor closest to the breakpoint among thin film transistors connected to the second portion, an orthographic projection of a first terminal of the second thin film transistor on the base substrate partially overlaps that of the second portion on the base substrate, the repairing method comprises: disconnecting a connection between a second terminal of the second thin film transistor and a corresponding data line; connecting the second portion to the first terminal of the second thin film transistor by soldering; connecting the first pixel electrode and the second pixel electrode to the repair line by soldering, respectively.

In some embodiments, taking a common electrode line segment from a common electrode line to which the first pixel electrode corresponds as a repair line comprises: cutting the common electrode line to which the first pixel electrode corresponds from gaps between the first pixel electrode and the second pixel electrode, and respective adjacent data lines.

In some embodiments, the defective signal line is the data line having the breakpoint, the repairing method comprises: cutting a gate line to which the first thin film transistor is connected to form a gate line body and a patch separated from the gate line body, the patch being connected to the first thin film transistor, the first thin film transistor being separated from the gate line body, a size of the patch is smaller than that of the gate line in a direction in which the data lines extend.

In some embodiments, electrically connecting the first terminal of the first thin film transistor to the first portion comprises: connecting the patch to the first terminal and the second terminal of the first thin film transistor by soldering, respectively.

In some embodiments, the gate line has a hollow opening, an orthographic projection of a junction between the second terminal of the first thin film transistor and a corresponding data line on the base substrate is located within an orthographic projection of the hollow opening on the base substrate, and an orthographic projection of the patch on the base substrate partially overlaps an orthographic projection of the first portion on the base substrate. Electrically connecting the first terminal of the first thin film transistor to the first portion comprises: connecting the patch to the first terminal of the first thin film transistor by soldering; connecting at least one of the second terminal of the first thin film transistor and the first portion to the patch by soldering.

In some embodiments, the orthographic projection of the repair line on the base substrate further partially overlaps an orthographic projection of the second portion on the base substrate, connecting the first pixel electrode to the second portion via the repair line comprises: connecting the first pixel electrode and the second portion to the repair line by soldering, respectively.

In some embodiments, taking a common electrode line segment from a common electrode line to which the first pixel electrode corresponds as a repair line comprises: cutting the common electrode line to which the first pixel electrode corresponds from a gap between the first pixel electrode and the data line and a gap between the second portion and the pixel electrode.

In some embodiments, the array substrate further comprises conductive bridges and common electrodes in one-to-one correspondence with pixel electrodes, each of the common electrodes being connected to a corresponding one of the common electrode lines, a plurality of common electrodes arranged along a direction in which one data line extend are connected to each other via the conductive bridges, the repairing method further comprises: cutting off a conductive bridge of a common electrode to which the first pixel electrode corresponds.

A further embodiment of the disclosure provides an array substrate, which comprises a base substrate, a plurality of gate lines, a plurality of data lines, a plurality of common electrode lines, and a plurality of thin film transistors, the plurality of gate lines and the plurality of data lines defining a plurality of pixel regions, each pixel region being provided with a pixel electrode, a gate and a first terminal of each of the thin film transistors being connected to corresponding gate line and pixel electrode respectively. The plurality of gate lines comprise at least one breakpoint gate line having a breakpoint, the breakpoint gate line being divided into a first portion and a second portion by the breakpoint, the array substrate comprises a first thin film transistor, the first thin film transistor being a thin film transistor closest to the breakpoint and connected to the first portion among the plurality of thin film transistors. A second terminal of the first thin film transistor is disconnected from the data lines, the first portion is electrically connected to the second portion via a first terminal of the first thin film transistor, a first pixel electrode connected to the first terminal of the first thin film transistor, and a repair line, the repair line is a common electrode line segment taken from a common electrode line to which the first pixel electrode corresponds and separated from a remaining portion of the common electrode line, an orthographic projection of the repair line on the base substrate partially overlapping that of the first pixel electrode on the base substrate.

In some embodiments, the orthographic projection of the repair line on the base substrate partially overlaps that of a second pixel electrode on the base substrate, the second pixel electrode is connected to a second thin film transistor, the second thin film transistor being a thin film transistor closest to the breakpoint among thin film transistors connected to the second portion, the repair line is connected to the second portion via the second pixel electrode and a first terminal of the second thin film transistor, a second terminal of the second thin film transistor is disconnected from the data lines.

According to another embodiment of the disclosure providing an array substrate, array substrate comprising a base substrate, a plurality of gate lines, a plurality of data lines, a plurality of common electrode lines, and a plurality of thin film transistors, the plurality of gate lines and the plurality of data lines defining a plurality of pixel regions, each pixel region being provided with a pixel electrode, a first terminal and a second terminal of each of the thin film transistors being connected to corresponding pixel electrode and data line respectively. The plurality of data lines comprise at least one breakpoint data line having a breakpoint, the breakpoint data line being divided into a first portion and a second portion by the breakpoint, the array substrate comprises a first thin film transistor, the first thin film transistor being a thin film transistor closest to the breakpoint and connected to the first portion among the plurality of thin film transistors. A gate line corresponding to the first thin film transistor is divided into a gate line body and a patch separated from the gate line body, the first thin film transistor and the gate line body being separated from each other, the first portion being electrically connected to the second portion via the patch, a first terminal of the first thin film transistor, a first pixel electrode connected to the first terminal of the first thin film transistor, and a repair line. The repair line is a common electrode line segment taken from a common electrode line to which the first pixel electrode corresponds and separated from a remaining portion of the common electrode line, an orthographic projection of the repair line on the base substrate partially overlapping that of the first pixel electrode on the base substrate.

In some embodiments, a size of the patch is smaller than that of the gate line in a direction in which the data lines extend.

In some embodiments, the first portion is further connected to the patch via a second terminal of the first thin film transistor.

In some embodiments, the array substrate further comprises conductive bridges and common electrodes in one-to-one correspondence with pixel electrodes, each of the common electrodes being connected to a corresponding one of the common electrode lines, wherein the common electrodes arranged along a direction in which one data line extends are connected to each other via the conductive bridges, wherein a conductive bridge of a common electrode to which the first pixel electrode corresponds is cut off.

Embodiments of the disclosure have been briefly summarized above. The embodiments and various technical features in the embodiments may be combined in different manners to form different embodiments, which also fall within the protection scope of the present application.

BRIEF DESCRIPTION OF DRAWINGS

In order to more clearly illustrate the technical solutions in embodiments of the present disclosure, the drawings used for describing the embodiments will be briefly introduced below. The drawings introduced below are only some embodiments of the present disclosure. Other drawings may also be obtained by those ordinarily skilled in the art based on these drawings without inventive efforts.

DETAILED DESCRIPTION OF EMBODIMENTS

To make the objective, technical solutions and advantages of the present disclosure clearer, embodiments of the disclosure will be further described in detail below with reference to the accompanying drawings.

Figure 1:
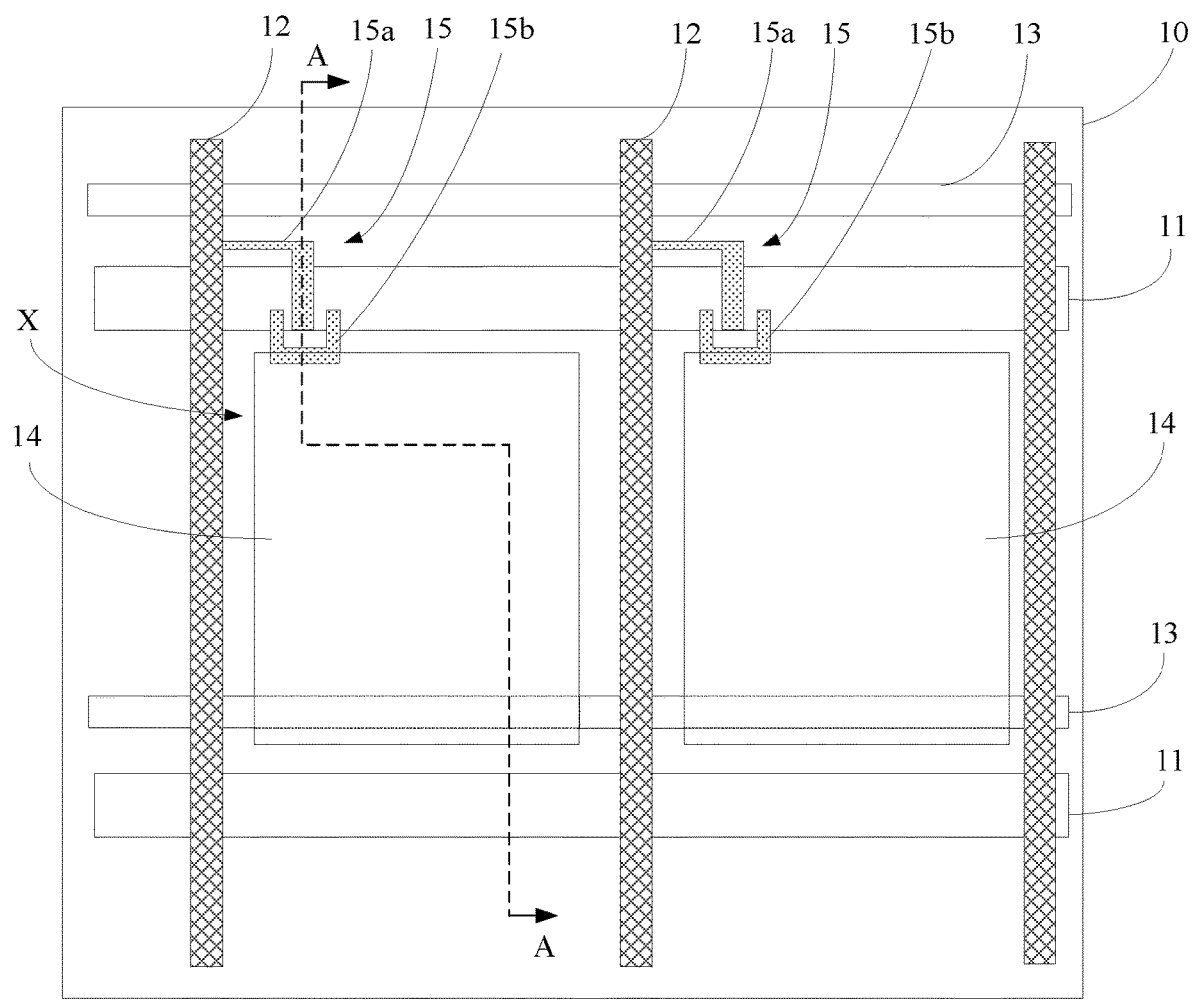
FIG. 1 is a partial structural view of an intact array substrate provided by an embodiment of the present disclosure.

FIG. 1 is a partial schematic view of an intact array substrate provided by an embodiment of the present disclosure. As shown in FIG. 1, the array substrate comprises a plurality of gate lines 11, a plurality of data lines 12, and a plurality of common electrode lines 13. The plurality of gate lines 11 and the plurality of data lines 12 define a plurality of pixel regions X, and each of the pixel regions X is provided with a pixel electrode 14. Each pixel electrode 14 is connected to the data line 12 through a thin film transistor 15. The plurality of gate lines 11 and the plurality of common electrode lines 13 are arranged in parallel and alternately.

The thin film transistor 15 comprises a source 15a, a drain 15b, and an active layer (not shown). The orthographic projection of a portion of the active layer between the source 15a and the drain 15b on the base substrate 10 is located within that of the gate line 11 on the base substrate 10, the orthographic projection of the drain 15b on the base substrate 10 partially overlaps that of the gate lines 11 on the base substrate 10, and the orthographic projection of a junction between the thin film transistor 15 and the data line 12 on the base substrate 10 is outside that of the gate line 11 on the base substrate 10.

Figure 2:
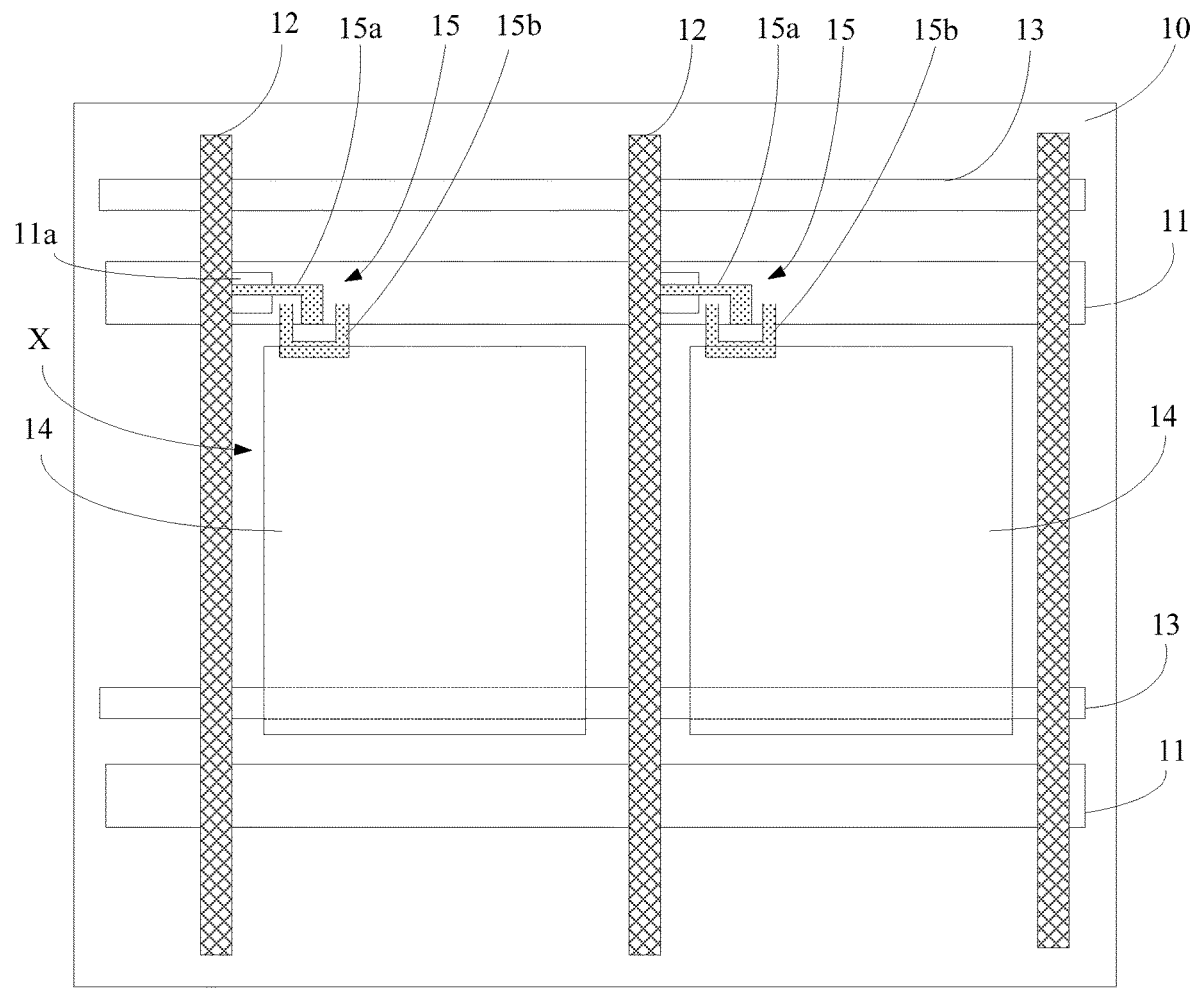
FIG. 2 is a schematic view of an intact array substrate provided by another embodiment of the present disclosure.

FIG. 2 is a schematic view of an intact array substrate provided by another embodiment of the present disclosure. The array substrate in FIG. 2 has substantially the same structure as the array substrate shown in FIG. 1, except that in the array substrate shown in FIG. 2, a hollow opening 11a is provided in the gate line 11, and the orthographic projection of a junction between the thin film transistor 15 and the data line 12 on the base substrate is located in the orthographic projection of the hollow opening 11a on the base substrate 10.

Figure 3:
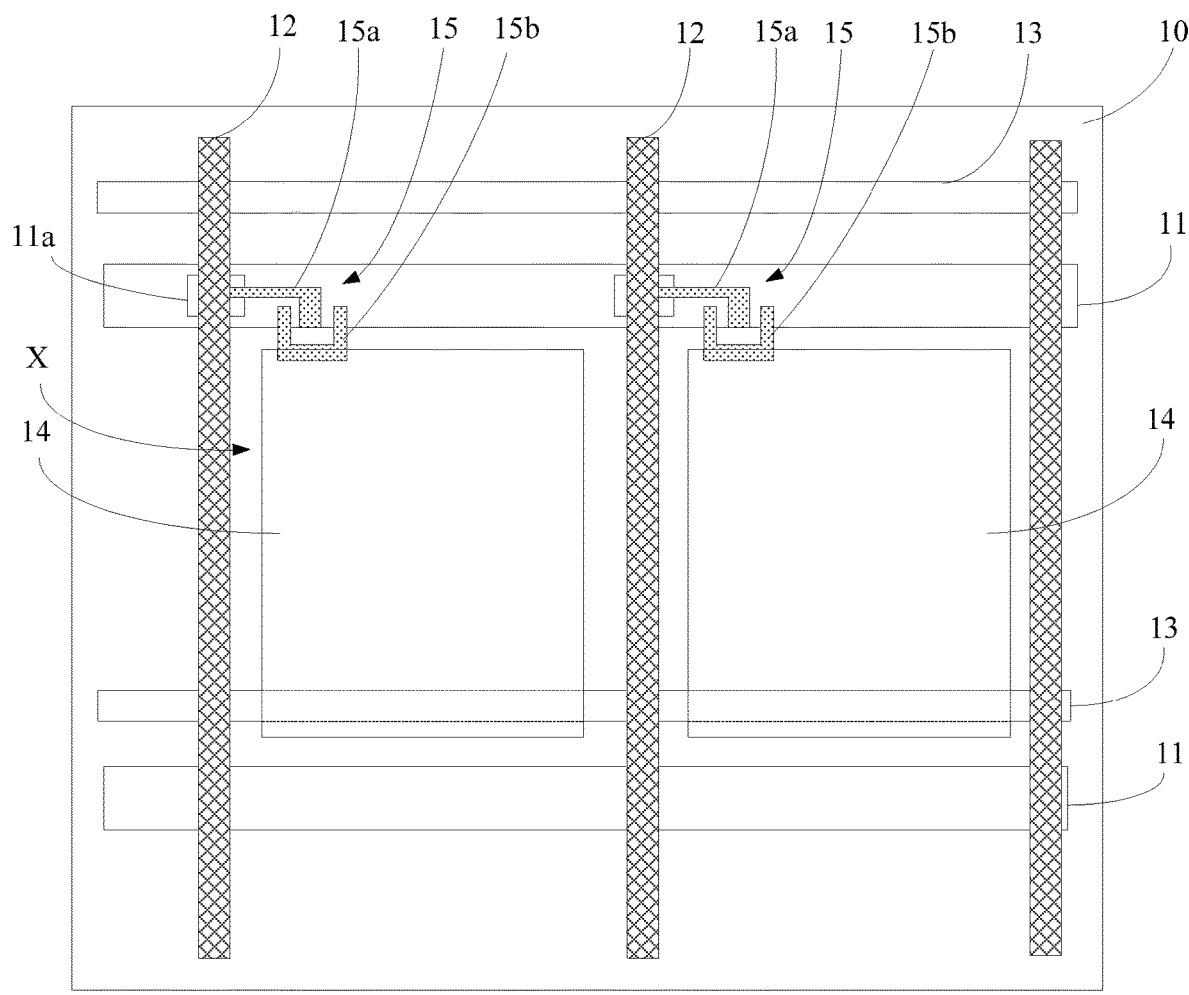
FIG. 3 is a schematic view of an intact array substrate provided by a further embodiment of the present disclosure.

FIG. 3 is a schematic view of an intact array substrate provided by a further embodiment of the disclosure. The array substrate shown in FIG. 3 has substantially the same structure as the array substrate shown in FIG. 2, except for the position of the hollow opening 11a. In the array substrate shown in FIG. 3, the orthographic projection of a junction between the thin film transistor 15 and the data line 12 on the base substrate is located within the orthographic projection of the hollow opening 11a on the base substrate 10, and the orthographic projection of a segment of the data line 12 is also located within the orthographic projection of the hollow opening 11a on the base substrate 10.

For the array substrates shown in FIG. 1 to FIG. 3, when a breakpoint occurs on the gate line 11 or the data line 12, pixel regions along the gate line or the data line where the breakpoint occurs may be unable to emit light normally, which in turn affects the normal display of images.

Figure 4:
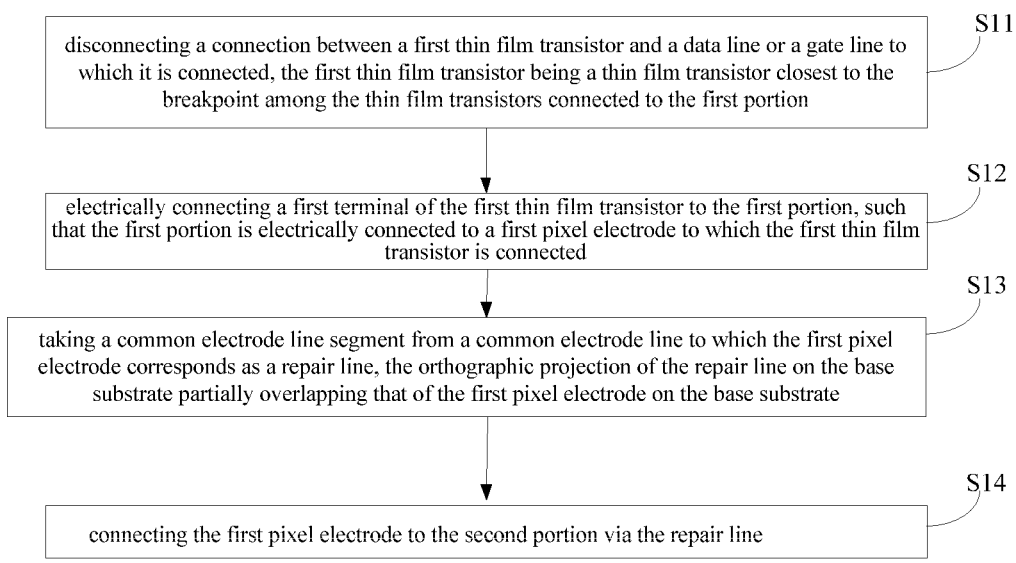
FIG. 4 is a flowchart of a repairing method for an array substrate provided by an embodiment of the present disclosure.

An embodiment of the disclosure provides a repairing method for an array substrate. The array substrate comprises a base substrate, a plurality of gate lines, a plurality of data lines, and a plurality of common electrode lines. The plurality of gate lines and the plurality of data lines define a plurality of pixel regions, and each of the pixel regions is provided with a pixel electrode. The pixel electrode is connected to the data line through a thin film transistor, a first terminal (one of the source and the drain) of the thin film transistor is connected to the pixel electrode, and a second terminal (the other of the source and the drain) of the thin film transistor is connected to the data line. The array substrate comprises at least one defective signal line. The defective signal line is a data line having a breakpoint or a gate line having a breakpoint, which is divided into a first portion and a second portion by the breakpoint. As shown in FIG. 4, the repairing method according to this embodiment comprises the following steps:

S11, disconnecting a connection between a first thin film transistor and a data line or a gate line to which the first thin film transistor is to connected, the first thin film transistor being a thin film transistor closest to the breakpoint among the thin film transistors connected to the first portion of the defective signal line;

S12, electrically connecting the first terminal of the first thin film transistor to the first portion, such that the first portion is electrically connected to a first pixel electrode to which the first thin film transistor is connected;

S13, taking a common electrode line segment from a common electrode line to which the first pixel electrode corresponds as a repair line, the orthographic projection of the repair line on the base substrate partially overlapping that of the first pixel electrode on the base substrate;

S14, connecting the first pixel electrode to the second portion via the repair line.

The repairing method provided by the above embodiment of the present disclosure and the structure of the array substrate obtained by using the repairing method will be described in detail below in reference with the structures of different array substrates and different breakpoint positions.

In some embodiments, the defective signal line is a gate line having a breakpoint, and at that time the repairing method comprises disconnecting a connection between the second terminal of the first thin film transistor and the data line.

Figure 5:
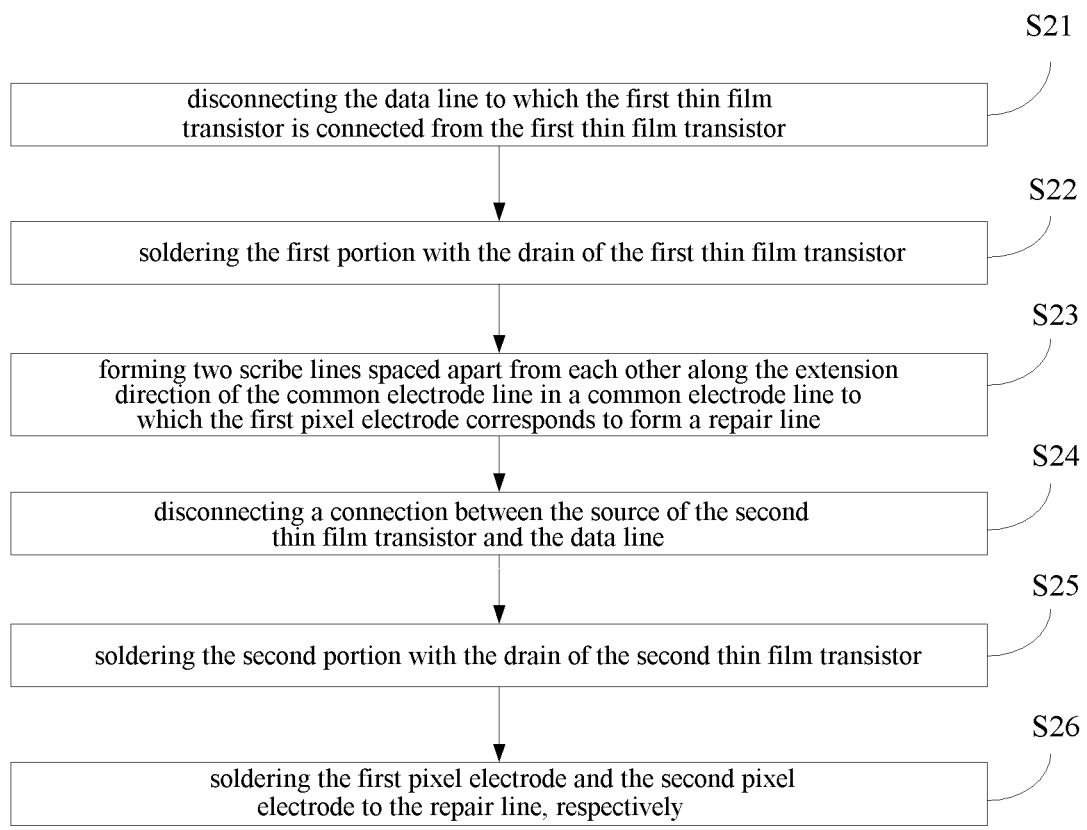
FIG. 5 is a flowchart of a repairing method for an array substrate provided by another embodiment of the present disclosure.
Figure 6:
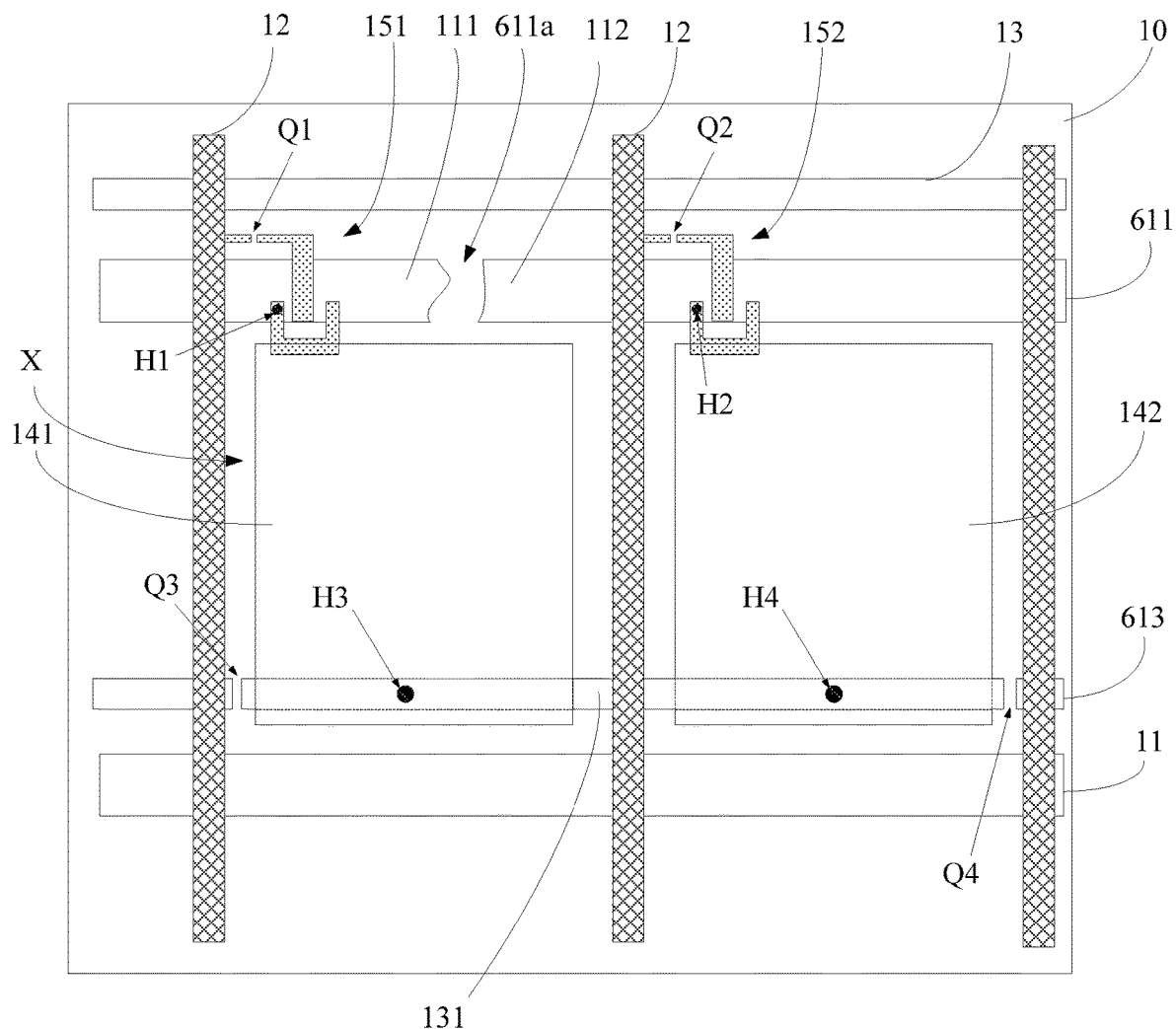
FIG. 6 is a schematic view of a repaired array substrate provided by an embodiment of the present disclosure.
Figure 7:
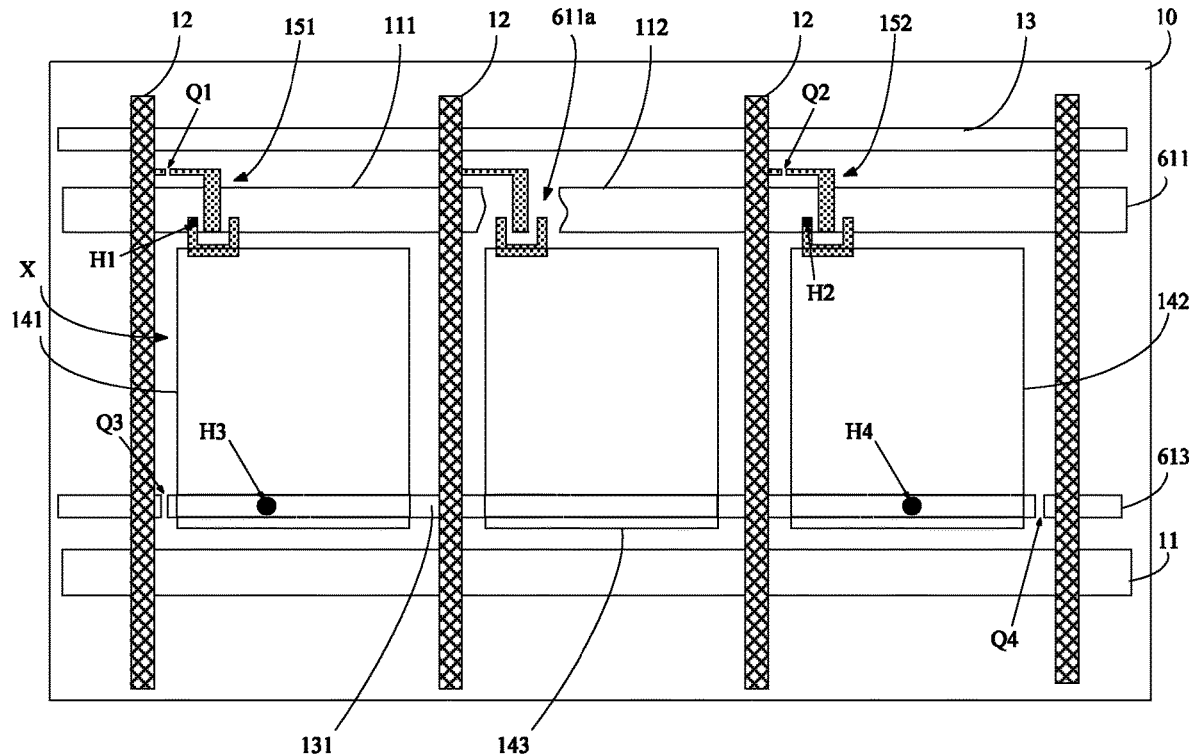
FIG. 7 is a schematic view of a repaired array substrate provided by another embodiment of the present disclosure.

FIG. 5 is a flowchart of a repairing method for an array substrate provided by another embodiment of the disclosure, which is used for repairing array substrate where the broken line is a gate line. Taking the array substrate shown in FIG. 1 as an example, the structure of the repaired array substrate is shown in FIG. 6 or FIG. 7, depending on different breakpoint positions on the gate line. The method comprises the following steps:

S21: disconnecting the data line to which the first thin film transistor is connected from the first thin film transistor.

Specifically, a laser cutting method may be used to cut off the second terminal (e.g., the source) of the first thin film transistor from a side of the base substrate, so that the first thin film transistor is disconnected from the data line. The scribe line formed is Q1 as shown in FIG. 6 or FIG. 7. After laser cutting, the source of the first thin film transistor 151 is separated from the data line 12.

In case laser cutting is employed, laser light can penetrate the base substrate 10 to fuse the source of the first thin film transistor 151, thereby disconnecting the source of the first thin film transistor 151 from the data line 12.

S22: connecting the first portion to the first terminal (e.g., the drain) of the first thin film transistor by soldering.

Utilizing a laser soldering method, a first portion 111 and a drain of a first thin film transistor 151 are soldered from the side of the base substrate 10 through an overlapping region between a gate line 611 and the drain of the first thin film transistor 151. The overlapping region refers to a region where the orthographic projection of the gate line 611 and that of the drain of the first thin film transistor 151 on the base substrate 10 overlap each other. The soldered dot formed is shown as H1 in FIG. 6 or FIG. 7. After laser soldering, the first portion 111 of the gate line 611 may be brought into conduction with a first pixel electrode 141 through the drain of the first thin film transistor 151.

In case laser soldering is employed, laser light can penetrate the base substrate 10, and the first portion 111 and the drain of the first thin film transistor 151 are fused by the high temperature generated by the laser beams, so that the first portion 111 may be brought into conduction with the drain of the first thin film transistor 151.

In case soldering and cutting are performed using laser, since laser light can penetrate the base substrate 10, a display device can be repaired even if the array substrate and the color filter substrate have been aligned and assembled.

S23: taking a common electrode line segment from of a common electrode line to which the first pixel electrode corresponds as a repair line, the orthographic projection of the repair line on the base substrate partially overlapping that of the first pixel electrode on the base substrate. For example, as shown in FIG. 6 or FIG. 7, two scribe lines spaced apart from each other along the extension direction of the common electrode line are formed in a common electrode line to which the first pixel electrode corresponds, so as to form a repair line.

Referring to FIG. 6 or FIG. 7, an orthographic projection of a portion of the repair line 131 on the base substrate overlaps that of a portion of the first pixel electrode 141 on the base substrate 10, and also overlaps the orthographic projection of a portion of a second pixel electrode 142 on the base substrate 10. The second pixel electrode 142 is connected to a second thin film transistor 152, and the second thin film transistor 152 is a thin film transistor closest to a breakpoint 611a among the thin film transistors connected to a second portion 112.

When a common electrode line 613 is being cut, it may also be cut by a laser cutting method from the side of the base substrate 10 to avoid damage to the array substrate.

The common electrode line 613 may be cut from gaps between the first pixel electrode 141 and the second pixel electrode 142, and the data line 12, so as to avoid damage to the array substrate during the process of cutting the common electrode line 613. The scribe lines formed are shown as Q3 and Q4 in FIG. 6 or FIG. 7.

S24: disconnecting a connection between the second terminal (e.g., the source) of the second thin film transistor and the data line.

The cutting method for the source of the second thin film transistor 152 is the same as the cutting method for the source of the first thin film transistor 151 in step S21. The scribe line formed is shown as Q2 in FIG. 6 or FIG. 7. After laser cutting, the source of the second thin film transistor 152 is separated from the data line 12.

S25: connecting the second portion to the first terminal of the second thin film transistor by soldering.

The second portion 112 and the first terminal (e.g., the drain) of the second thin film transistor 152 are soldered together in the same manner as the first portion 111 and the drain of the first thin film transistor 151 are soldered in step S22. The soldered dot formed is H2 as shown in FIG. 6 or FIG. 7. After laser soldering, the second portion 112 of the gate line 611 may be brought into conduction with the second pixel electrode 142 through the drain of the second thin film transistor 152.

S26: connecting the first pixel electrode and the second pixel electrode to the repair line by soldering, respectively.

Specifically, the repair line 131 and the first pixel electrode 141, the repair line 131 and the second pixel electrode 142 may be respectively soldered together by a laser soldering method from the side of the base substrate 10, so that the first portion 111 of the gate line 611 is brought into conduction with the second portion 112 of the gate line 611 through the first thin film transistor 151, the first pixel electrode 141, the repair line 131, the second pixel electrode 142, and the second thin film transistor 152 sequentially. The soldered dots formed are H3 and H4 as shown in FIG. 6 or FIG. 7. After laser soldering, the repair line 131 is in connection with the first pixel electrode 141 and the second pixel electrode 142.

FIG. 6 is a schematic view of an array substrate provided by an embodiment of the present disclosure, where a defective signal line in the array substrate has been repaired. Taking one defective signal line as an example, as shown in FIG. 6, the defective signal line is a gate line 611 having a breakpoint 611a, and the breakpoint 611a is located between two adjacent thin film transistors (such as the first thin film transistor 151 and the second thin film transistor 152 in FIG. 6) arranged along the gate line 611.

The array substrate comprises a base substrate 10, a plurality of gate lines 11, a plurality of data lines 12, a plurality of common electrode lines, and a plurality of thin film transistors. Each of the pixel regions is provided with a pixel electrode, and the gate and the first terminal of each of the thin film transistors are connected to a corresponding gate line and a corresponding pixel electrode respectively. The plurality of gate lines include at least one breakpoint gate line 611 having a breakpoint. The breakpoint gate line 611 is divided into a first portion 111 and a second portion 112 by the breakpoint. The array substrate comprises a first thin film transistor 151. The first thin film transistor 151 is a thin film transistor closest to the breakpoint and connected to the first portion 111 among the plurality of thin film transistors. The second terminal of the first thin film transistor 151 is disconnected from the data line 12. The first portion 111 is electrically connected to the second portion 112 via the first terminal of the first thin film transistor 151, a first pixel electrode 141 connected to the first terminal, and a repair line 131. The repair line 131 is a segment of a common electrode line taken from the common electrode line to which the first pixel electrode 141 corresponds and separated from the remaining portion of the common electrode line, and the orthographic projection of the repair line 131 on the base substrate partially overlaps that of the first pixel electrode on the base substrate. In the embodiment shown in FIG. 6, the orthographic projection of the repair line 131 on the base substrate 10 partially overlaps that of the second pixel electrode 142 on the base substrate. The second pixel electrode 142 is connected to a second thin film transistor 152, which is a thin film transistor closest to the breakpoint among the thin film transistors connected to the second portion 112. The repair line 131 is connected to the second portion 611 via the second pixel electrode 142 and the first terminal of the second thin film transistor 152, and the second terminal of the second thin film transistor 152 is disconnected from the data line 12.

As shown in FIG. 6, the orthographic projection of the common electrode line 613 to which the first pixel electrode 141 corresponds on the base substrate 10 partially overlaps the orthographic projections of the first pixel electrode 141 and the second pixel electrode 142 on the base substrate 10. The first pixel electrode 141 and the second portion 112 are connected by the repair line 131 which is cutting out of the common electrode line 613. The orthographic projection of a portion of the repair line 131 overlaps a portion of the orthographic projection of the first pixel electrode 141 on the base substrate 10, and the orthographic projection of the other portion of the repair line 131 overlaps a portion of the orthographic projection of the second pixel electrode 142 on the base substrate 10. Two ends of the repair line 131 are connected to the first pixel electrode 141 and the second pixel electrode 142, respectively.

For the repaired array substrate, the first portion 111 may be brought into conduction with the first pixel electrode 141 through the drain of the first thin film transistor 151, the second portion 112 may be brought into conduction with the second pixel electrode 142 through the drain of the second thin film transistor 152, and the first pixel electrode 141 is in conduction with the second pixel electrode 142 through the repair line 131, so as to restore the function of the gate line 611 having the breakpoint 611*a*, so all the thin film transistors arranged along the gate line 611 other than the first thin film transistor 151 and the second thin film transistor 152 can operate normally. As a result, with two pixel regions being sacrificed, other pixel regions return to normal, which reduces the number of pixel regions that cannot be normally displayed due to the breakage of the gate line 611, and improves the yield of the display panel.

FIG. 7 is a schematic view of a repaired array substrate provided by another embodiment of the disclosure. Taking one defective signal line as an example, as shown in FIG. 7, the defective signal line is a gate line 611 having a breakpoint 611*a* located at a junction between the gate line 611 and a thin film transistor.

As shown in FIG. 7, a first portion 111 and a second portion 112 of the gate line 611 located on two sides of the breakpoint 611*a* are also correspondingly connected to a first thin film transistor 151 and a second thin film transistor 152, and a third thin film transistor 153 between the first thin film transistor 151 and the second thin film transistor 152 is disconnected from the gate line 611 due to the presence of the breakpoint 611*a*. A third pixel electrode 143 is located between the first pixel electrode 141 and the second pixel electrode 142, and the third thin film transistor 153 is connected to the third pixel electrode 143.

The orthographic projection of a common electrode line 613 to which the first pixel electrode 141 corresponds on the base substrate 10 partially overlaps the orthographic projections of the first pixel electrode 141, the second pixel electrode 142, and the third pixel electrode 143 on the base substrate 10, and the first pixel electrode 141 and the second portion 112 are connected by a repair line 131 which is cut out of the common electrode line 613. A portion of the orthographic projection of the repair line 131 on the base substrate overlaps portions of the orthographic projections of the first pixel electrode 141, the second pixel electrode 142 and the third pixel electrode 143 on the base substrate 10, and two ends of the repair line 131 are connected to the first pixel electrode 141 and the second pixel electrode 142, respectively.

For the repaired array substrate, the first portion 111 may be brought into conduction with the first pixel electrode 141 through the drain of the first thin film transistor 151, the second portion 112 may be brought into conduction with the second pixel electrode 142 through the drain of the second thin film transistor 152, and the first pixel electrode 141 is in conduction with the second pixel electrode 142 through the repair line 131, so that the gate line 611 having the breakpoint 611*a* may return to its function, and all the thin film transistors arranged along the gate line 611 other than the first thin film transistor 151, the second thin film transistor 152 and the third thin film transistor 153 can operate normally. As a result, only three pixel regions need to be sacrificed, other pixel regions can operate normally, which reduces the number of pixel regions that cannot be normally displayed due to the breakage of the gate line 611, and improves the yield of the display panel.

It is to be noted that, for the array substrates shown in FIG. 2 and FIG. 3, when a breakpoint occurs on the gate line, it may also be repaired in the way shown in the array substrate as shown in FIG. 6 or FIG. 7.

Figure 8:
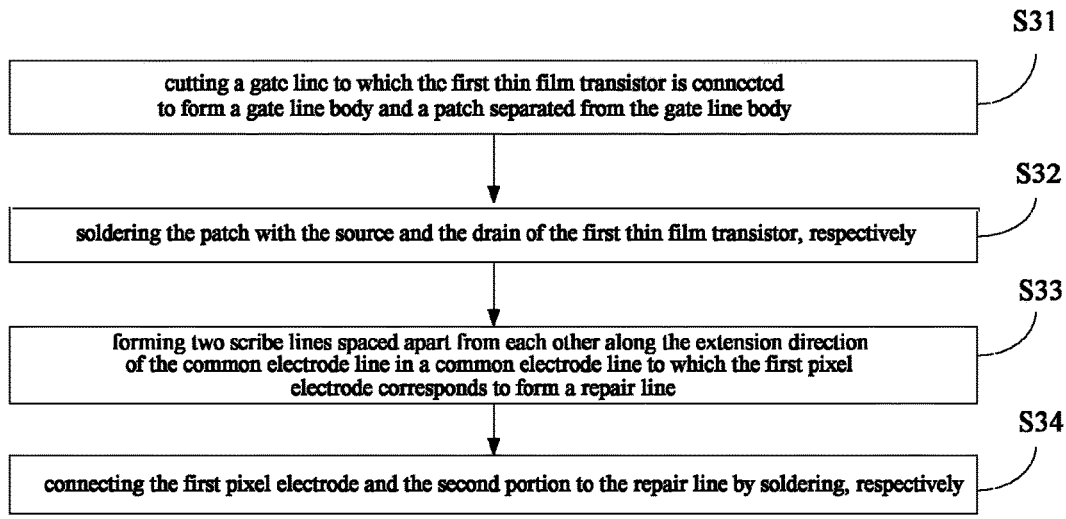
FIG. 8 is a flowchart of a repairing method for an array substrate provided by a further embodiment of the present disclosure.
Figure 9:
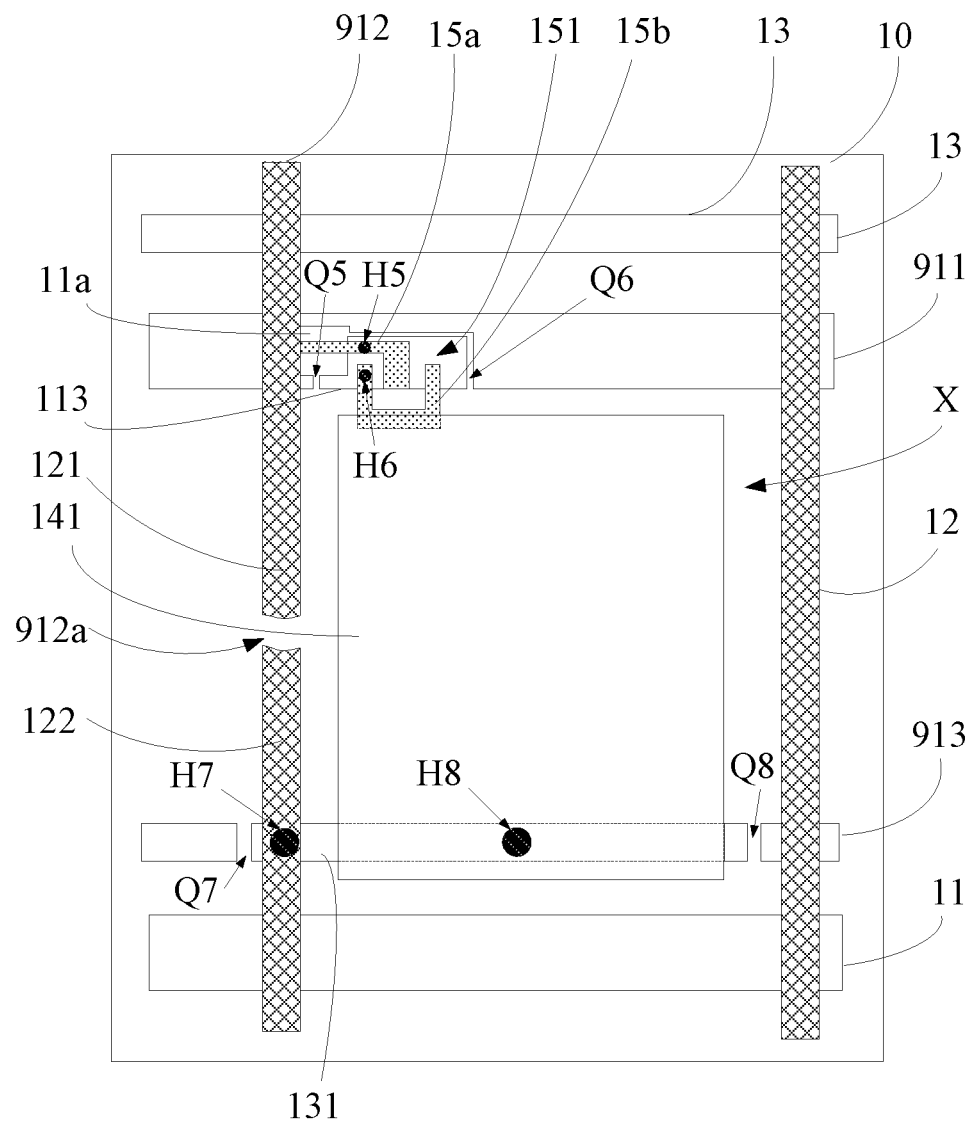
FIG. 9 is a schematic view of a repaired array substrate provided by a further embodiment of the present disclosure.

FIG. 8 is a flowchart of a repairing method for an array substrate provided by another embodiment of the present disclosure. In this embodiment, the defective signal line is a data line having a breakpoint. The structure of the repaired array substrate is as shown in FIG. 9. The method comprises the following steps:

S31: cutting a gate line to which the first thin film transistor is connected, to form a gate line body and a patch separated from the gate line body.

After cutting, a gate line main body 911 and a patch 113 are formed. The patch 113 is connected to a first thin film transistor 151, and the first thin film transistor 151 is separated from the gate line main body 911. In the direction in which a data line 912 extends, the size of the patch is smaller than that of a gate line 11 to ensure that the gate line 11 is not cut off after the patch 113 is obtained.

Specifically, cutting may be performed from the side of the base substrate 10 using a laser cutting method to prevent laser light from damaging the array substrate. The scribe lines formed are Q5 and Q6 as shown in FIG. 9.

S32: connecting the patch to the first terminal and the second terminal of the first thin film transistor by soldering, respectively.

The patch 113 and the drain of the first thin film transistor 151, and the patch 113 and the source of the first thin film transistor 151 may be connected by using a laser soldering method from the side of the base substrate 10. The soldered dots formed are H5 and H6 as shown in FIG. 9.

S33: forming two scribe lines spaced apart from each other along the extension direction of the common electrode line on the common electrode line to which the first pixel electrode corresponds to form a repair line.

The cutting method for the common electrode line in step S33 is substantially the same as the cutting method in step S23. The difference only lies in the position of cutting.

Referring to FIG. 9, the orthographic projection of the repair line 131 on the base substrate 10 partially overlaps that of the first pixel electrode 141 on the base substrate 10, and the orthographic projection of the repair line 131 on the base substrate 10 further partially overlaps the orthographic projection of a second portion 122 of the data line 912 on the base substrate 10.

When the common electrode line 913 is being cut, it may be cut from a gap between the first pixel electrode 141 and the data line and a gap between the second portion 122 of the data line 912 and the pixel electrode, so as to avoid damage to the array substrate during the process of cutting the common electrode line 913. The scribe lines formed are Q7 and Q8 as shown in FIG. 9.

S34: connecting the first pixel electrode and the second portion to the repair line by soldering, respectively.

Specifically, the repair line 131 and the first pixel electrode 141, and the repair line 131 and the second portion 122 of the data line 912 may be soldered together from the side of the base substrate 10 using a laser soldering method, so that a first portion 121 of the data line 912 is brought into conduction with the second portion 122 of the data line 912 through the first thin film transistor 151, the first pixel electrode 141 and the repair line 131 sequentially. The soldered dots formed are H7 and H8 as shown in FIG. 9.

FIG. 9 is a schematic view of an array substrate provided by another embodiment of the disclosure. In this embodiment, a data line having a breakpoint has been repaired. As shown in FIG. 9, the array substrate comprises a base substrate 10, a plurality of gate lines 11, a plurality of data lines 12, a plurality of common electrode lines 13, and a plurality of thin film transistors. The first terminal and the second terminal of each of the thin film transistors are connected to a corresponding pixel electrode and a corresponding data line respectively. The plurality of data lines include at least one breakpoint data line 912 having a breakpoint 912a. The breakpoint data line 912 is divided into a first portion 121 and a second portion 122 by the breakpoint 912a. The array substrate comprises a first thin film transistor 151 which is a thin film transistor closest to the breakpoint 912a and connected to the first portion 121 among the plurality of thin film transistors. A gate line corresponding to the first thin film transistor is divided into a gate line body 911 and a patch 113 separated from the gate line body, the first thin film transistor 151 and the gate line body 911 are separated from each other, and the first portion 121 is electrically connected to the second portion 122 via the patch 113, the first terminal of the first thin film transistor 151, the first pixel electrode 141 connected to the first terminal, and the repair line 131. The repair line 131 is a segment of common electrode line which is cut out of the common electrode line to which the first pixel electrode corresponds and separated from the remaining portion of the common electrode line, and the orthographic projection of the repair line 131 on the base substrate partially overlaps that of the first pixel electrode on the base substrate.

As shown in FIG. 9, the cut gate line includes a gate line body 911 and a patch 113 separated from the gate line body 911. The first thin film transistor 151 and the gate line body 911 are separated from each other, and the patch 113 is connected to a source 15a and a drain 15b of the first thin film transistor 151. In the direction in which the data line 912 extends, the size of the patch 113 is smaller than that of the gate line, and the patch 113 is formed by cutting the gate line. By cutting a patch 113 from the gate line, for connecting the data line 912 with the drain 15b of the first thin film transistor 151, the first portion 121 of the data line 912 may be brought into conduction with the first pixel electrode 141.

As shown in FIG. 9, the orthographic projection of a common electrode line 913 to which the first pixel electrode 141 corresponds on the base substrate 10 partially overlaps the orthographic projections of the first pixel electrode 141 and the second portion 122 of the data line 912 on the base substrate 10. The first pixel electrode 141 and the second portion 122 of the data line 912 are connected by a repair line 131, and the repair line 131 is cut out of the common electrode line 913. The orthographic projection of repair line 131 on the base substrate 10 partially overlaps the orthographic projections of the first pixel electrode 141 and the second portion 122 of the data line 912 on the base substrate 10. Two ends of the repair line 131 are connected to the first pixel electrode 141 and the second portion 122 of the data line 912 respectively. Since the size of the patch 113 is smaller than that of the gate line in the direction in which the data line 912 extends, the gate line body 911 is not cut off and can still be conductive. As a result, other pixel regions are returned to normal with only the first pixel electrode 141 being sacrificed, which reduces the number of pixel regions that cannot be normally displayed due to the breakage of the data line 912, and improves the yield of the display panel.

Figure 10:
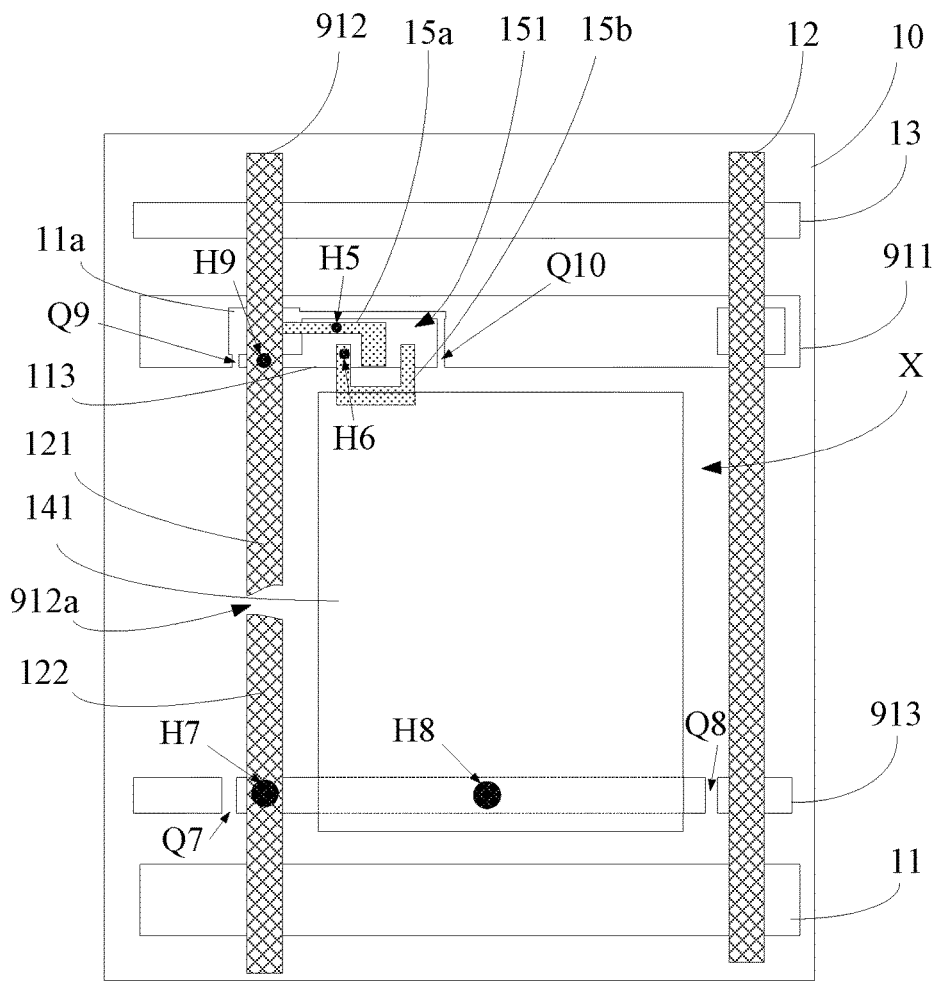
FIG. 10 is a schematic view of a repaired array substrate provided by yet another embodiment of the present disclosure.

A further embodiment of the disclosure provides another repairing method for an array substrate, which method can be used for repairing the array substrate shown in FIG. 3 when a data line is broken, and the repaired structure is as shown in FIG. 10. In this embodiment, the gate line 911 has a hollow opening 11a, the orthographic projection of a junction between the second terminal of the first thin film transistor 151 and a corresponding data line on the base substrate is located within that of the hollow opening on the base substrate, and the orthographic projection of the patch 113 on the base substrate partially overlaps the orthographic projection of the first portion 121 on the base substrate. The step of electrically connecting the first terminal of the first thin film transistor 151 to the first portion 121 includes: connecting the patch 113 to the first terminal of the first thin film transistor by soldering; connecting at least one of the second terminal of the first thin film transistor and the first portion 121 to the patch 113 by soldering.

In the embodiment of FIG. 10, the orthographic projection of the repair line on the base substrate further partially overlaps the orthographic projection of the second portion 122 on the base substrate. Connecting the first pixel electrode to the second portion via the repair line includes: connecting the first pixel electrode 141 and the second portion 122 to the repair line by soldering, respectively. The repair line may be obtained by cutting the common electrode line to which the first pixel electrode corresponds from a gap between the first pixel electrode 141 and the data line and a gap between the second portion 122 and the pixel electrode.

In an embodiment, the patch 113 is soldered with the drain of the first thin film transistor. The soldered dot formed is H6 as shown in FIG. 10.

The source of the first thin film transistor and the first portion 121 are soldered with the patch 131, respectively. The soldered dots formed are H5 and H9 as shown in FIG. 10.

As shown in FIG. 10, the orthographic projection of the patch 113 on the base substrate 10 partially overlaps that of the data line 912 on the base substrate 10. The patch 113 is connected to the data line 912. In this embodiment, the source of the first thin film transistor 151 and the first portion 121 of the data line 912 are soldered with the patch 113, respectively, so that the first portion 121 of the data line 912 may be brought into conduction with the first pixel electrode 141 through two paths, which helps to reduce the resistance. In this embodiment, the scribe lines between the patch 113 and the gate line body 911 are Q9 and Q10 as shown in FIG. 10. The difference between the scribe line Q9 in FIG. 10 and the scribe line Q5 in FIG. 9 lies in that the scribe line Q9 is located on a side of the data line 912 having the breakpoint 912a away from the first pixel electrode 141 in a direction parallel to the base substrate 10.

In other embodiments, it is also possible to solder only one of the source of the first thin film transistor 151 and the first portion 121 of the data line 912 with the patch 113, that is, only one of the soldered dots H5 and H9 is formed. If only the first portion 121 of the data line 912 is soldered with the patch 113, the connection between the source of the first thin film transistor 151 and the data line 912 may be not necessary.

Figure 11:
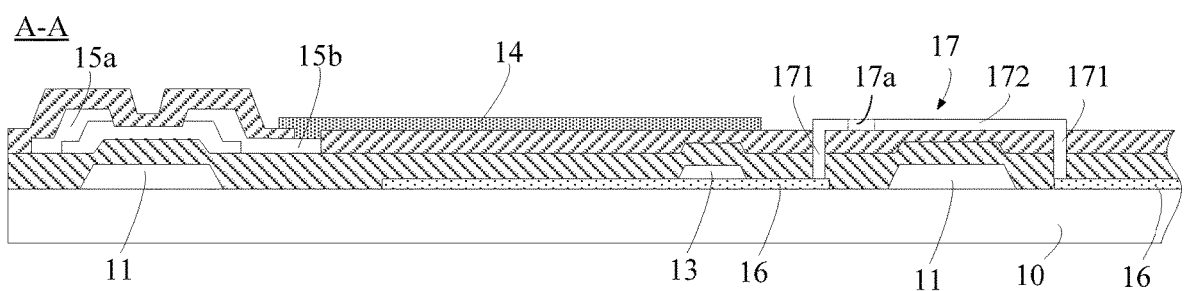
FIG. 11 is a sectional view taken along line A-A in FIG. 1.

In some implementations, the array substrate further comprises conductive bridges and common electrodes in one-to-one correspondence with pixel electrodes. Each of the common electrodes is connected to a corresponding one of the common electrode lines, and the common electrodes arranged along the direction in which the data lines extend are connected to each other via the conductive bridges. In this case, the repairing method further comprises: cutting off the conductive bridge of a common electrode to which the first pixel electrode corresponds. For example, FIG. 11 is a sectional view of the array substrate shown in FIG. 1 taken along A-A. As shown in FIG. 11, each common electrode 16 is connected to a common electrode line 13, a plurality of common electrodes 16 arranged along the direction in which the data line 12 extends are connected to each other through conductive bridges 17, and the conductive bridge 17 for the common electrode 16 corresponding to the first pixel electrode is cut off. As shown in FIG. 11, the conductive bridge 17 may include a via hole 171 connected to the common electrode 16 and a conductive dielectric layer 172 connecting via holes 171 of two adjacent common electrodes 16 arranged along the direction in which the data line 12 extends. In this way, the same row of common electrodes 16 (common electrodes arranged along the same common electrode line) may be electrically connected through the common electrode line 13, and adjacent rows of common electrodes 16 may be electrically connected through the conductive bridge 17.

For an array substrate (such as the array substrate shown in FIG. 6) where the breakpoint of a gate line is located between two adjacent pixel electrodes, when the gate line is being repaired, it is further required to cut off the conductive bridges for connecting adjacent rows of common electrodes on the common electrode corresponding to the first pixel electrode and the common electrode corresponding to the second pixel electrode. For an array substrate (such as the array substrate shown in FIG. 7) where the breakpoint is located at the junction between the gate line and the thin film transistor, it is further required to cut off the conductive bridge for connecting adjacent rows of common electrodes on the common electrode corresponding to the third pixel electrode, so as to prevent the repair line from being brought into conduction with other rows of common electrodes through the common electrode, ensuring that the array substrate may operate normally. For an array substrate (such as the array substrate shown in FIGS. 9 and 10) where the breakpoint is located on the data line, during repairing, it is required to cut off the conductive bridge for connecting adjacent rows of common electrodes on the common electrode corresponding to the first pixel electrode. In this way, the repair line may be disconnected from the common electrodes of other pixel regions. After the common electrode line 13 is cut to form the repair line, the common electrodes arranged along the cut common electrode line 13 can still operate normally, ensuring that the array substrate may operate normally. For example, as shown in FIG. 11, a scribe line 17a is formed in the conductive dielectric layer 172 to cut off the conductive bridge 17, and the orthographic projection of the scribe line 17a on the base substrate 10 is located at the gap between the common electrode 16 and an adjacent gate 11.

The connections between the first thin film transistor and the gate lines or data lines except the defective signal line are cut off so that the first thin film transistor is only connected to the defective signal line and the first pixel electrode. The first portion and the first pixel electrode are connected through an overlapping region between the gate line and the drain of the first thin film transistor, so that the defective signal line can be connected to the first pixel electrode through the first thin film transistor. Further, by taking a repair line from the common electrode line and connecting the first pixel electrode to the second portion by the repair line, the first portion may be brought into conduction with the second portion through the first thin film transistor, the first pixel electrode and the repair line. Therefore, the number of pixel regions that cannot be normally displayed due to the breakage of the defective signal line can be reduced, and the yield of the display panel is improved.

It is to be noted that FIGS. 1 to 3, 6, 7 and 9 to 11 are all partial schematic views of the array substrate, which are not intended to limit the actual size.

It is to be noted that in the various repairing methods shown in FIGS. 4, 5 and 8, respective soldered dots and scribe lines are not necessarily formed in order, that is, the respective steps are not sequential. In practice, all the cutting operations can be performed first, and then all the soldering operations are performed, alternatively, all the soldering operations can be performed first, and then all the cutting operations are performed, which can facilitate operation. In addition, the repairing methods provided by embodiments of the present disclosure may be applied to the product where the array substrate and the color filter substrate have been aligned and assembled.

What have been stated above are only some embodiments of the disclosure, and are not intended to limit the application. Any modifications, equivalent substitutions, improvements, etc. made within the spirit and principle of the disclosure shall be encompassed within the protection scope of the application.

The invention claimed is:

1. A repairing method for an array substrate, the array substrate comprising a base substrate, a plurality of gate lines, a plurality of data lines, and a plurality of common electrode lines, the plurality of gate lines and the plurality of data lines defining a plurality of pixel regions, each pixel region being provided with a pixel electrode, the pixel electrode being connected to a data line of the plurality of data lines through a thin film transistor, a first terminal of the thin film transistor being connected to the pixel electrode, a second terminal of the thin film transistor being connected to the data line,
 wherein the array substrate comprises at least one defective signal line, the defective signal line being a gate line of the plurality of gate lines having a breakpoint, the defective signal line being divided by the breakpoint into a first portion and a second portion, wherein the repairing method comprises:
 disconnecting a connection between a first thin film transistor and a first data line of the plurality of data lines to which the first thin film transistor is connected, the first thin film transistor being a thin film transistor closest to the breakpoint among thin film transistors connected to the first portion;
 electrically connecting the first terminal of the first thin film transistor to the first portion such that the first portion is electrically connected to a first pixel electrode connected to the first thin film transistor;
 taking a common electrode line segment from a common electrode line of the plurality of common electrode lines to which the first pixel electrode corresponds as a repair line, an orthographic projection of the repair line on the base substrate partially overlapping an orthographic projection of the first pixel electrode on the base substrate; and
 connecting the first pixel electrode to the second portion via the repair line,
 wherein the repairing method further comprises disconnecting a connection between the second terminal of the first thin film transistor and the first data line,
 wherein the orthographic projection of the repair line on the base substrate partially overlaps an orthographic projection of a second pixel electrode on the base substrate, the second pixel electrode is connected to a second thin film transistor, the second thin film transistor being a thin film transistor closest to the breakpoint among the thin film transistors connected to the second portion, wherein an orthographic projection of a first terminal of the second thin film transistor on the base substrate partially overlaps that of the second portion on the base substrate,
 wherein the repairing method further comprises:
  disconnecting a connection between a second terminal of the second thin film transistor and a second data line of the plurality of data lines;
  connecting the second portion to the first terminal of the second thin film transistor by soldering; and
  connecting the first pixel electrode and the second pixel electrode to the repair line by soldering, respectively,
 wherein taking the common electrode line segment from the common electrode line to which the first pixel electrode corresponds as the repair line comprises: cutting the common electrode line from gaps between the first pixel electrode and the second pixel electrode, and respective adjacent data lines of the plurality of data lines.

2. The repairing method according to claim 1, wherein an orthographic projection of the first terminal of the first thin film transistor on the base substrate partially overlaps an orthographic projection of the first portion of the defective signal line on the base substrate, the repairing method comprises connecting the first portion to the first terminal of the first thin film transistor by soldering.

3. A repairing method for an array substrate, the array substrate comprising a base substrate, a plurality of gate lines, a plurality of data lines, and a plurality of common electrode lines, the plurality of gate lines and the plurality of data lines defining a plurality of pixel regions, each pixel region being provided with a pixel electrode, the pixel electrode being connected to a corresponding data line of the plurality of data lines through a thin film transistor, a first terminal of the thin film transistor being connected to the pixel electrode, a second terminal of the thin film transistor being connected to the corresponding data line,
 wherein the array substrate comprises at least one defective signal line, the defective signal line being a data line of the plurality of data lines having a breakpoint, the defective signal line being divided by the breakpoint into a first portion and a second portion, wherein the repairing method comprises:
 disconnecting a connection between a first thin film transistor and a first gate line to which the first thin film transistor is connected, the first thin film transistor being a thin film transistor closest to the breakpoint among thin film transistors connected to the first portion;
 electrically connecting the first terminal of the first thin film transistor to the first portion such that the first portion is electrically connected to a first pixel electrode connected to the first thin film transistor;
 taking a common electrode line segment from a common electrode line to which the first pixel electrode corresponds as a repair line, an orthographic projection of the repair line on the base substrate partially overlapping an orthographic projection of the first pixel electrode on the base substrate; and
 connecting the first pixel electrode to the second portion via the repair line, wherein the defective signal line is the the repairing method comprises:
 cutting first gate line to which the first thin film transistor is connected to form a gate line body and a patch separated from the gate line body, the patch being connected to the first thin film transistor, the first thin film transistor being separated from the gate line body, wherein a size of the patch is smaller than a size of the first gate line in a direction in which the data lines extend.

4. The repairing method according to claim 3, wherein electrically connecting the first terminal of the first thin film transistor to the first portion comprises:
 connecting the patch to the first terminal and the second terminal of the first thin film transistor by soldering, respectively.

5. The repairing method according to claim 3, wherein the first gate line has a hollow opening, an orthographic projection of a junction between the second terminal of the first thin film transistor and a corresponding data line on the base substrate is located within an orthographic projection of the hollow opening on the base substrate, and an orthographic projection of the patch on the base substrate partially overlaps an orthographic projection of the first portion on the base substrate,
 wherein electrically connecting the first terminal of the first thin film transistor to the first portion comprises:
 connecting the patch to the first terminal of the first thin film transistor by soldering;
 connecting at least one of the second terminal of the first thin film transistor and the first portion to the patch by soldering.

6. The repairing method according to claim 3, wherein the orthographic projection of the repair line on the base substrate further partially overlaps an orthographic projection of the second portion on the base substrate,
   wherein connecting the first pixel electrode to the second portion via the repair line comprises: connecting the first pixel electrode and the second portion to the repair line by soldering, respectively.

7. The repairing method according to claim 3, wherein taking the common electrode line segment from the common electrode line to which the first pixel electrode corresponds as the repair line comprises:
   cutting the common electrode line to which the first pixel electrode corresponds from a gap between the first pixel electrode and the data line and a gap between the second portion and the pixel electrode.

8. The repairing method according to claim 1, wherein the array substrate further comprises conductive bridges and common electrodes in one-to-one correspondence with pixel electrodes, each of the common electrodes being connected to a corresponding one of the common electrode lines, wherein a plurality of common electrodes arranged along a direction in which the data line extend are connected to each other via the conductive bridges, wherein the repairing method further comprises:
   cutting off a conductive bridge of a common electrode to which the first pixel electrode corresponds.

9. An array substrate comprising a base substrate, a plurality of gate lines, a plurality of data lines, a plurality of common electrode lines, and a plurality of thin film transistors, the plurality of gate lines and the plurality of data lines defining a plurality of pixel regions, each pixel region being provided with a pixel electrode, a first terminal and a second terminal of each of the thin film transistors being connected to a corresponding pixel electrode and a corresponding data line respectively,
   wherein the plurality of data lines comprise at least one breakpoint data line having a breakpoint, the breakpoint data line being divided into a first portion and a second portion by the breakpoint, wherein the array substrate comprises a first thin film transistor, the first thin film transistor being a thin film transistor closest to the breakpoint and connected to the first portion among the plurality of thin film transistors,
   wherein a first gate line of the plurality of gate lines corresponding to the first thin film transistor is divided into a gate line body and a patch separated from the gate line body, the first thin film transistor and the gate line body being separated from each other, the first portion being electrically connected to the second portion via the patch, the first terminal of the first thin film transistor, a first pixel electrode connected to the first terminal of the first thin film transistor, and a repair line, wherein a size of the patch is smaller than a size of the first gate line in a direction in which the data lines extend; and
   wherein the repair line is a common electrode line segment taken from a common electrode line to which the first pixel electrode corresponds and separated from a remaining portion of the common electrode line, an orthographic projection of the repair line on the base substrate partially overlapping that of the first pixel electrode on the base substrate.

10. The array substrate according to claim 9, wherein the first portion is further connected to the patch via the second terminal of the first thin film transistor.

11. The array substrate according to claim 9, wherein the array substrate further comprises conductive bridges and common electrodes in one-to-one correspondence with pixel electrodes, each of the common electrodes being connected to a corresponding one of the common electrode lines, wherein the common electrodes arranged along a direction in which the data line extends are connected to each other via the conductive bridges, wherein a conductive bridge of a common electrode to which the first pixel electrode corresponds is cut off.

* * * * *